(12) United States Patent
Safinowski et al.

(10) Patent No.: US 12,124,176 B2
(45) Date of Patent: Oct. 22, 2024

(54) INSPECTION APPARATUS

(71) Applicant: ASML NETHERLANDS B.V., Veldhoven (NL)

(72) Inventors: Pawel Safinowski, Arendonk (BE); Derk Servatius Gertruda Brouns, Herentals (BE)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/943,809

(22) Filed: Sep. 13, 2022

(65) Prior Publication Data
US 2023/0004093 A1 Jan. 5, 2023

Related U.S. Application Data

(63) Continuation of application No. 17/283,588, filed as application No. PCT/EP2019/078152 on Oct. 17, 2019, now Pat. No. 11,474,438.

(30) Foreign Application Priority Data

Oct. 23, 2018 (EP) .................................... 18202014
Jan. 11, 2019 (EP) .................................... 19151427

(51) Int. Cl.
  *G03F 7/20* (2006.01)
  *G03F 1/62* (2012.01)
  *G03F 7/00* (2006.01)
(52) U.S. Cl.
  CPC .............. *G03F 7/7065* (2013.01); *G03F 1/62* (2013.01)

(58) Field of Classification Search
CPC .............. G03F 7/7065; G03F 1/62; G03F 1/84
See application file for complete search history.

(56) References Cited

U.S. PATENT DOCUMENTS

| 5,502,306 A | 3/1996 | Meisburger et al. |
| 5,652,657 A | 7/1997 | Yoshii et al. |
| 5,882,413 A | 3/1999 | Beaulieu et al. |
| (Continued) | | |

FOREIGN PATENT DOCUMENTS

| CN | 1570761 | 1/2005 |
| CN | 102460129 | 5/2012 |
| (Continued) | | |

OTHER PUBLICATIONS

International Search Report and Written Opinion issued in corresponding PCT Patent Application No. PCT/EP2019/078152, dated Apr. 15, 2020.

(Continued)

*Primary Examiner* — Mesfin T Asfaw
(74) *Attorney, Agent, or Firm* — Pillsbury Winthrop Shaw Pittman, LLP (57) ABSTRACT

An inspection apparatus for inspecting an object such as a pellicle for use in an EUV lithographic apparatus, the inspection apparatus including: a vacuum chamber; a load lock forming an interface between the vacuum chamber and an ambient environment; and a stage apparatus configured to receive the object from the load lock and displace the object inside the vacuum chamber, wherein the vacuum chamber comprises a first parking position and a second parking position for temporarily storing the object.

20 Claims, 6 Drawing Sheets

(56) References Cited

U.S. PATENT DOCUMENTS

| | | |
|---|---|---|
| 6,721,045 B1 | 4/2004 | Hunter |
| 7,723,704 B2 | 5/2010 | Wood, II et al. |
| 8,383,297 B2 | 2/2013 | Shirasaki et al. |
| 9,186,630 B2 | 11/2015 | Golzhauser et al. |
| 9,958,770 B2 | 5/2018 | Ahn et al. |
| 10,073,337 B2 | 9/2018 | Jung et al. |
| 10,935,673 B2 | 3/2021 | Van Der Kerkhof |
| 2002/0196336 A1 | 12/2002 | Batson et al. |
| 2004/0019408 A1 | 1/2004 | Del Puerto et al. |
| 2004/0263823 A1 | 12/2004 | Klomp et al. |
| 2006/0181266 A1 | 8/2006 | Toro-Lira |
| 2007/0002301 A1 | 1/2007 | Venema |
| 2007/0029504 A1 | 2/2007 | Saito et al. |
| 2008/0138177 A1 | 6/2008 | Klomp et al. |
| 2008/0225261 A1 | 9/2008 | Hirayanagi |
| 2010/0208978 A1* | 8/2010 | Terasawa ............... B82Y 40/00 382/145 |
| 2012/0081684 A1 | 4/2012 | Den Oef et al. |
| 2014/0312227 A1 | 10/2014 | Yoshikawa et al. |
| 2017/0122913 A1 | 5/2017 | Riviere et al. |
| 2017/0301508 A1 | 10/2017 | Ma et al. |
| 2018/0040452 A1 | 2/2018 | Hatakeyama et al. |

FOREIGN PATENT DOCUMENTS

| | | |
|---|---|---|
| JP | H05198660 | 8/1993 |
| JP | 2004064079 | 2/2004 |
| JP | 2005501216 | 1/2005 |
| JP | 2007042522 | 2/2007 |
| JP | 2017053893 | 3/2017 |
| KR | 20080061999 | 7/2008 |
| KR | 20090032876 | 4/2009 |
| TW | 201705490 | 2/2017 |
| TW | 201829995 | 8/2018 |
| WO | 2017/125352 | 7/2017 |
| WO | 2018/065861 | 4/2018 |

OTHER PUBLICATIONS

Office Action issued in corresponding Taiwanese Patent Application No. 108137989, dated Mar. 7, 2023.

Office Action issued in corresponding Chinese Patent Application No. 201980069782.5, dated Dec. 15, 2023.

Office Action dated Apr. 10, 2024 issued in Israeli Patent Application No. 282440.

* cited by examiner

INSPECTION APPARATUS

This application is a continuation of U.S. patent application Ser. No. 17/283,588 which was filed on Apr. 8, 2021, now allowed, which is the U.S. national phase entry of PCT Patent Application No. PCT/EP2019/078152 which was filed on Oct. 17, 2019, which is claims the benefit of priority of European Patent Application No. 19151427.2 which was filed on Jan. 11, 2019 and European Patent Application No. 18202014 .9 which was filed on Oct. 23, 2018, each of the foregoing applications is incorporated herein in its entirety by reference.

FIELD

The present description relates to an inspection tool or apparatus as can be used for the inspection of objects, in particular objects used in the manufacturing of integrated circuits using an EUV lithographic apparatus. In particular, the inspection tool or apparatus may be used to inspect pellicles that are used in an EUV lithographic apparatus to shield a patterned reticle from contamination.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

the patterning device as mentioned is, in case of an EUV lithographic apparatus often shielded by a pellicle. Prior to the application of the pellicle, the pellicle needs to undergo a qualification or inspection process, in order to assess that it meets specification.

In known arrangements, such a qualification process may be rather time-consuming and may not have the required accuracy.

SUMMARY

It is an object to provide in an inspection apparatus for inspection of an object such as a pellicle, whereby the processing time is reduced and/or the accuracy is improved.

According to an aspect, there is provided an inspection apparatus for inspecting an object such as a pellicle for use in an EUV lithographic apparatus, the inspection apparatus comprising:
  a vacuum chamber;
  a load lock forming an interface between the vacuum chamber and an ambient environment;
  a stage apparatus configured to receive the object from the load lock and displace the object inside the vacuum chamber,
wherein the vacuum chamber comprises a first parking position and a second parking position for temporarily storing the object.

According to an aspect, there is provided an inspection apparatus for inspecting an object such as a pellicle for use in an EUV lithographic apparatus, the inspection apparatus comprising:
  a vacuum chamber;
  a first load lock forming an interface between the vacuum chamber and an ambient environment;
  a second load lock forming an interface between the vacuum chamber and an ambient environment;
  a stage apparatus configured to receive the object from the first load lock and displace the object inside the vacuum chamber and configured to provide the object to the second load lock.

According to an aspect, there is provided an inspection apparatus for inspecting an object such as a pellicle for use in an EUV lithographic apparatus, the inspection apparatus comprising:
  a chamber configured to provide in a conditioned atmosphere for inspecting the object;
  a load lock forming an interface between the chamber and an ambient environment;
  a radiation beam source configured to generate a radiation beam for inspecting the object;
  a radiation beam measurement system configured to measure a characteristic of the radiation beam, wherein the radiation beam measurement system comprises:
    a member arranged in an optical path of the radiation beam between the radiation beam source and the object, the member comprising an aperture to allow part of the radiation beam to propagate to the object, and
    at least one radiation sensor arranged on the member and configured to measure to the characteristic of the radiation beam.

BRIEF DESCRIPTION OF THE DRAWINGS

Embodiments of the invention will now be described, by way of example only, with reference to the accompanying schematic drawings, in which.

DETAILED DESCRIPTION

Figure 1:
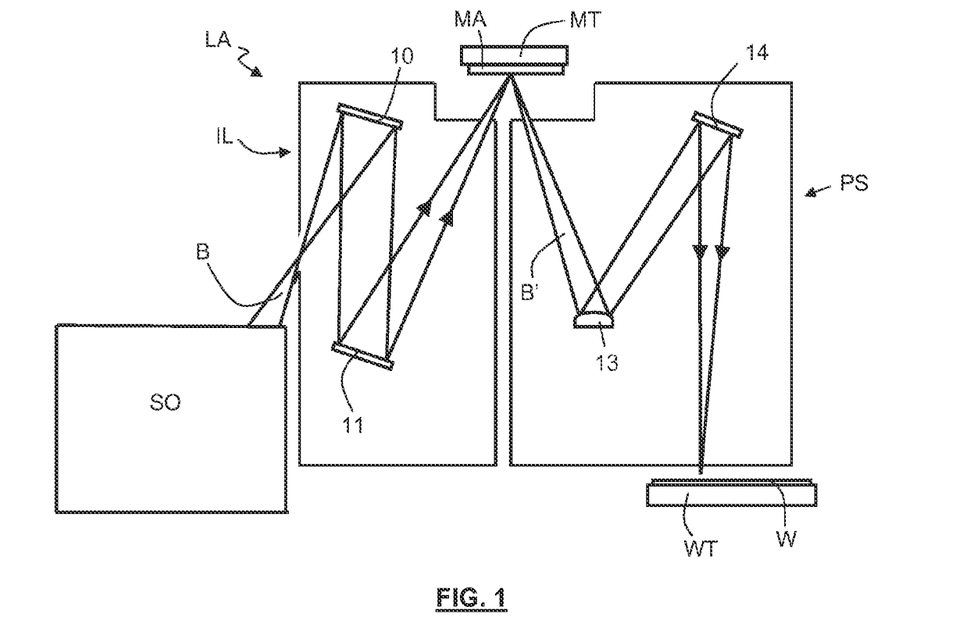
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors). The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

An embodiment of the present invention relates to manufacture of components for an apparatus or for use in an apparatus. The apparatus may be a lithographic apparatus, for example an extreme ultraviolet (EUV) lithographic apparatus such as may be used to fabricate integrated circuit chips. The components may be, for example, membranes or pellicles for use in the apparatus.

During production of components, it may be necessary to test the components to ensure they satisfy certain criteria. Some tests may be carried out in a specific environment, for example a vacuum environment. This may be provided in a vacuum chamber. It will be appreciated, of course, that other processing, measurements or handling of the components may also be performed in the vacuum chamber. In order to maintain a vacuum environment within the vacuum chamber, an antechamber (also known as a load lock) may be provided. A component can be inserted into the load lock at ambient pressure. The load lock is then sealed, and the air pumped out until vacuum conditions matching those of the vacuum chamber are prevalent in the load lock. The load lock is then opened to the vacuum chamber and the component can then be moved from the load lock to the vacuum chamber ready for testing or other procedures to be carried out. When the component is to be removed from the vacuum chamber, the process is reversed. In other words, the component is transferred to the load lock in a vacuum and the load lock is sealed off from the vacuum chamber. Ambient pressure is then restored to the load lock by pumping air into the space inside the load lock. Once ambient pressure is reached, the load lock can be opened, and the component removed.

In the case of sensitive and/or delicate components, such as a pellicle for an EUV apparatus, the pumping and venting time may be of the order of a few hours in order to preserve mechanical integrity of the component by maintaining a low-pressure differential as well as reduce the risk of contamination by keeping the gas flow speed low. This may be significantly greater than the time taken to test the component(s) in the vacuum chamber, for example up to twice as long.

An embodiment of the present invention discloses two solutions to the above problem. In a first aspect, there is provided an inspection apparatus for inspecting an object or a component, e.g. a pellicle for use in an EUV lithographic apparatus.

In accordance with the first embodiment, the inspection apparatus comprises:
 a vacuum chamber;
 a load lock forming an interface between the vacuum chamber and an ambient environment;
 a stage apparatus configured to receive the component from the load lock and displace the object inside the vacuum chamber.

In addition, according to the first embodiment, in order to reduce total manufacturing and/or testing time, or, more specifically, to increase throughput of components, it is proposed to use part of the vacuum chamber for storage of components such that the loading and/or unloading phase can be performed for a first component at the same time as a second component is being tested.

In particular, in an embodiment of the present invention, the vacuum chamber of the inspection apparatus comprises a first parking position and a second parking position. In accordance witan embodiment, a parking position refers to a position or location where a component may be temporarily stored.

In accordance with the first embodiment of the present invention, it is thus proposed to provide two parking positions inside the vacuum chamber. As will be illustrated below, the application of two parking positions inside the vacuum chamber enables the operating of the load lock while a first component is present inside the load lock, said operating e.g. including pumping out air out of the load lock or pumping air into the load lock, at the same time as the processing, e.g. inspecting of a second component that is arranged inside the vacuum chamber. A possible sequence for this process is illustrated further in FIGS. 2A to 2F below. FIGS. 2A to 2F schematically show plan views of an inspection apparatus 100 according to an embodiment. In the embodiment as shown, the inspection apparatus comprises a vacuum chamber 110, a load lock 120, a stage apparatus 130, whereby the vacuum chamber 110 includes two parking positions 140.1 and 140.2, also indicated as PP1 and PP2.

Figure 2A:
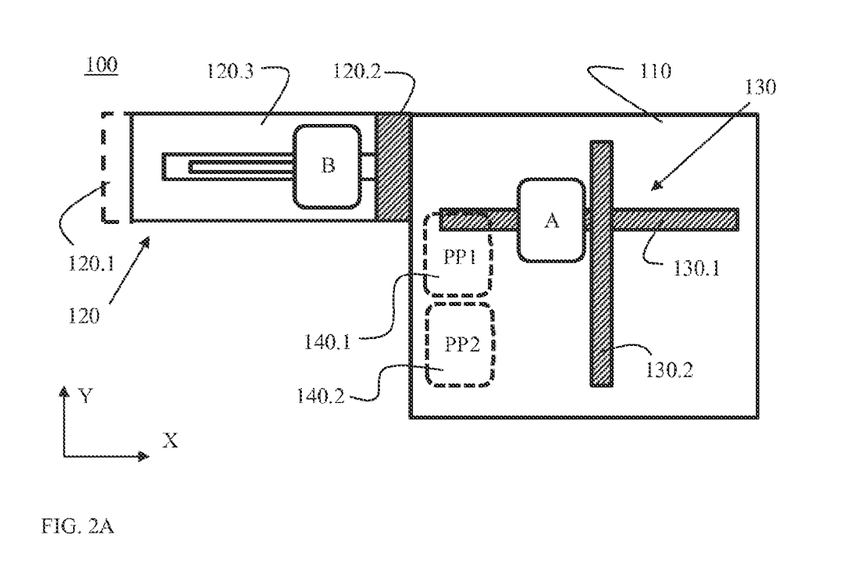
FIGS. 2A-2F depict a first embodiment of an inspection apparatus.

In an embodiment, a load lock such as load lock 120 may be considered an interface between a first atmosphere and a second atmosphere, e.g. between an ambient atmosphere or environment and a vacuum environment. Such a load lock may e.g. comprise comprises a first door, dotted lines 120.1, a second door 120.2 and a load lock chamber 120.3, the first door 120.1 being configured to separate the ambient environment from the load lock chamber 120.3, the second door 120.2 being configured to separate the vacuum chamber 110 from the load lock chamber 120.3. In general, the load lock chamber 120.3 should be large enough to house a component, e.g. product A or product B.

FIG. 2A shows the inspection apparatus 100 during a first process step in which a first component (Product A, e.g. a pellicle) undergoes measurement or inspection in the vacuum chamber while a second component (Product B) is being loaded into the load lock. In the embodiment as shown, the stage apparatus 130 comprises an X stage 130.1 configured to displace the product that is mounted to the stage apparatus, i.e. product A in FIG. 2A, in the X-direction and a Y-stage configured to displace the product A in the Y-direction.

The load lock is sealed off from the vacuum chamber; i.e. door 120.2 is closed. After loading of the product B into the load lock, in particular the load lock chamber 120.3, the first door 120.1 can be closed as well and the air can be pumped out of the load lock chamber 120.3. This process of pumping out air can take place while the product A is being measured.

Figure 2B:
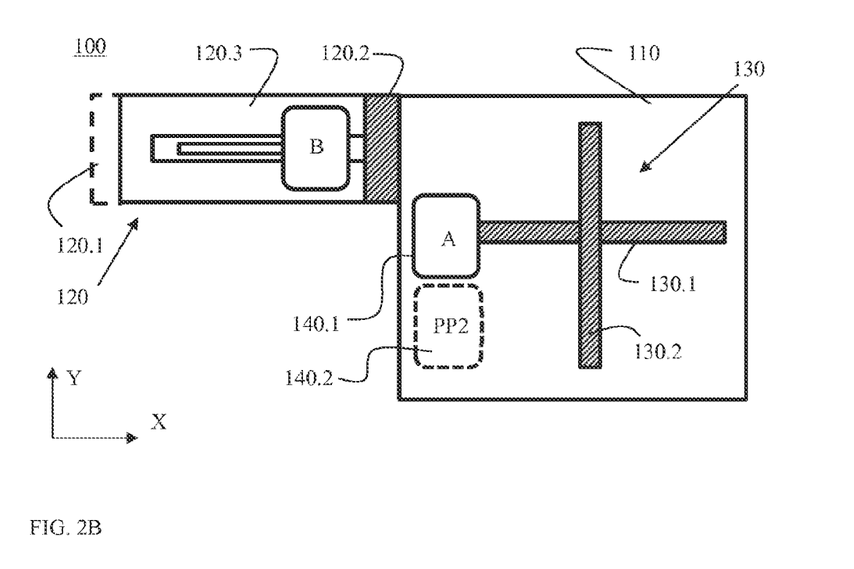

In a second step, shown in FIG. 2B, Product A is moved to the first storage area (parking position 1, PP1, 140.1). In an embodiment, this step can e.g. be performed by the stage apparatus 130, in particular the X-stage 130.1 and the Y-stage 130.2. In an embodiment, the stage apparatus 130 may e.g. comprise one or more linear motors, e.g. a linear motor for displacing the object, e.g. the pellicle, along the X-direction and a linear motor for displacing the object along the Y-direction.

Figure 2C:
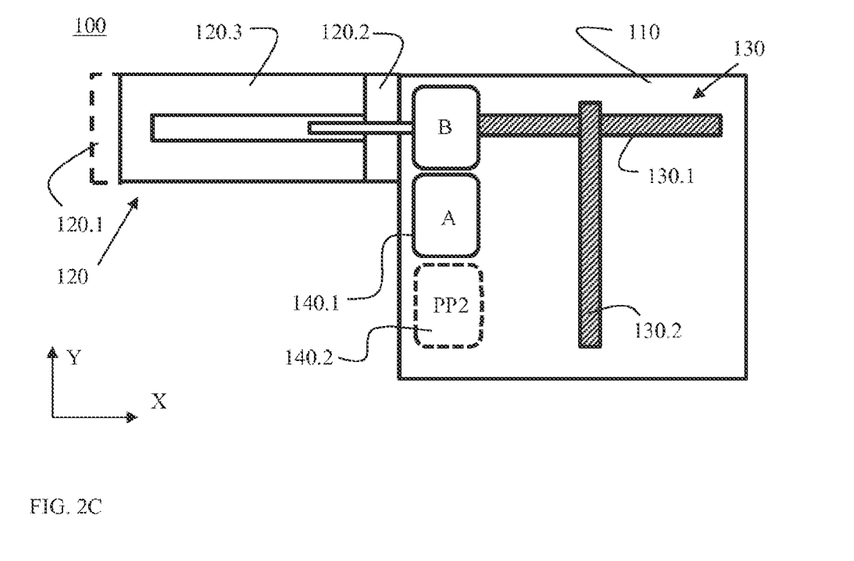

In a third step, shown in FIG. 2C, the load lock door 120.2 to the vacuum chamber 110 is opened and Product B is retrieved from the load lock 120 and moved into the vacuum chamber 110 while Product A remains in the first storage area 140.1.

Figure 2D:
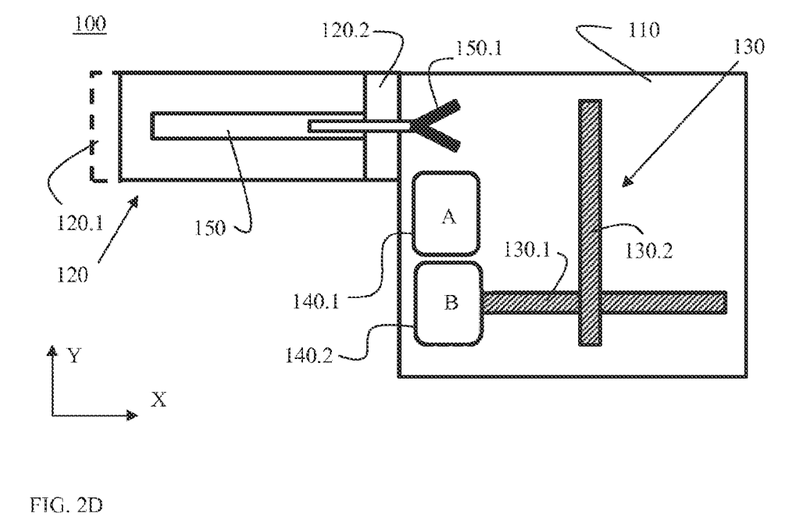

In a fourth step, shown in FIG. 2D, Product B is moved to a second storage area (parking position 2, PP2, 140.2). In the embodiment as shown, the load lock 120 comprises a transfer mechanism 150 configured to transfer an object from the load lock 120 to the stage apparatus 130 and vice versa. It can be pointed out that such a transfer mechanism may also be located on the stage apparatus or elsewhere in the vacuum chamber 110. In an embodiment, an end portion 150.1 of the transfer mechanism may e.g. be configured to hold the object and lift and/or lowering the object.

Figure 2E:
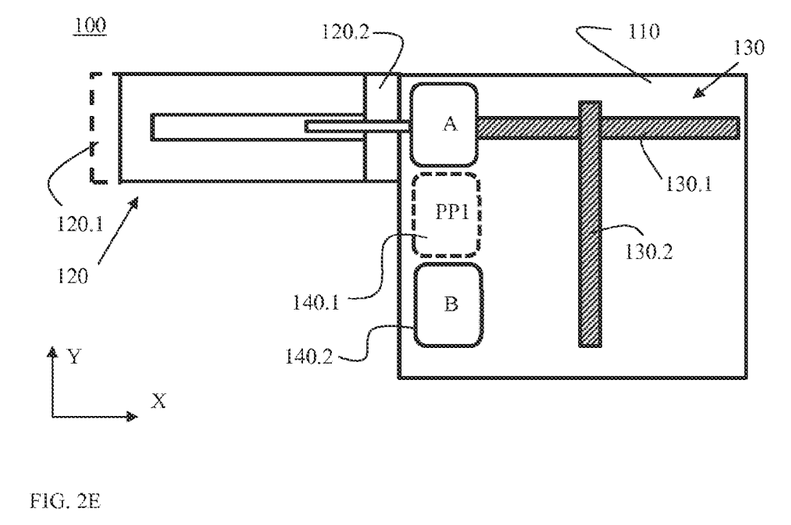

In a fifth step, shown in FIG. 2E, Product A is returned to the load lock 120 from the first storage area 140.1. In this respect, it can be pointed out that, due to the application of two parking positions PP1 and PP2, this transfer can be performed by the stage apparatus 130. As such, due to the use of two parking positions, there is no requirement to install or use an additional transfer robot in the vacuum chamber.

Figure 2F:
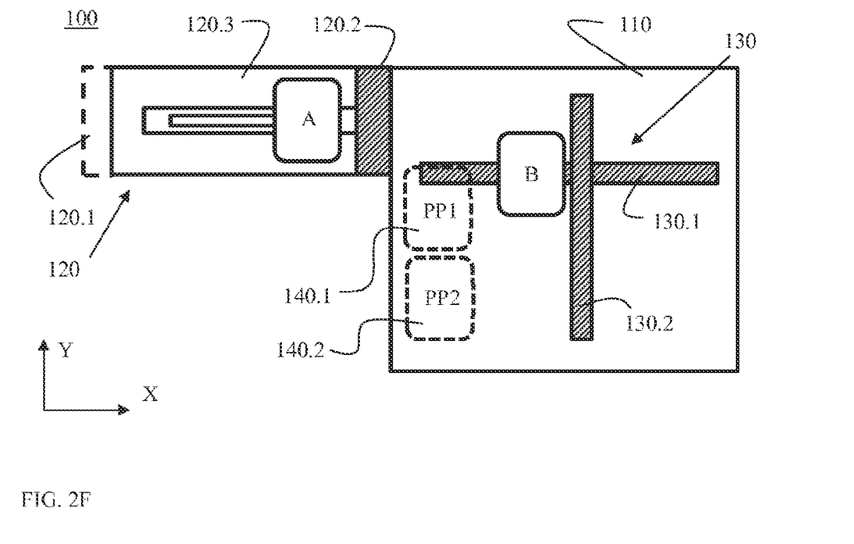

Finally, in a sixth step, shown in FIG. 2F, the load lock 120 is sealed, i.e. load lock door 120.2 is closed, and returned to ambient conditions while Product B is tested. Once the load lock 120 returns to ambient conditions, Product A can be unloaded.

By using the first and second storage areas within the vacuum chamber, it is possible to reduce the measurement cycle time by a factor of approximately 1.5. This is because, in particular, a second component may be loaded or unloaded while a first component is undergoing measurement. In such a configuration, the loading/unloading time for one component overlaps with the measurement process time for another component, thus improving throughput of components to be tested/measured and reducing total processing time.

According to a second embodiment of the first aspect of the invention, a second load lock may be used. In this configuration, loading and unloading may occur simultaneously. For example, while a first component is being measured, a second component may be unloaded following a previous measurement and a third component may be loaded prior to a subsequent measurement. Use of this process may reduce the measurement cycle time by up to two times. This may also reduce the amount of manufacturing equipment and/or clean-room space required for manufacturing the components since the throughput increases significantly.

Figure 3A:
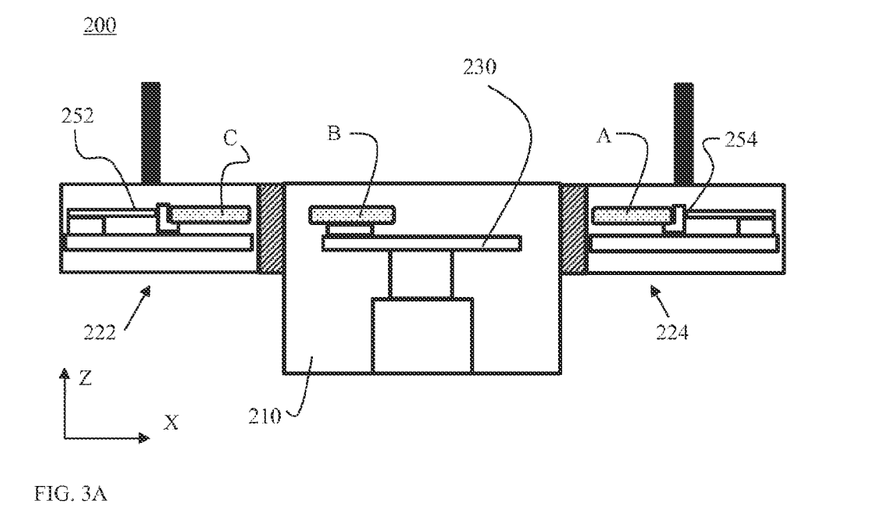
FIGS. 3A-3C depict a second embodiment of an inspection apparatus.
Figure 3B:
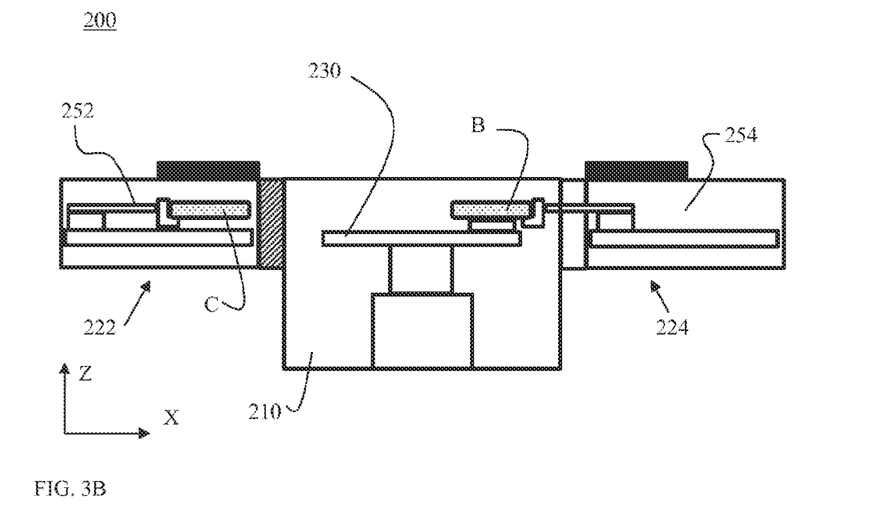
Figure 3C:
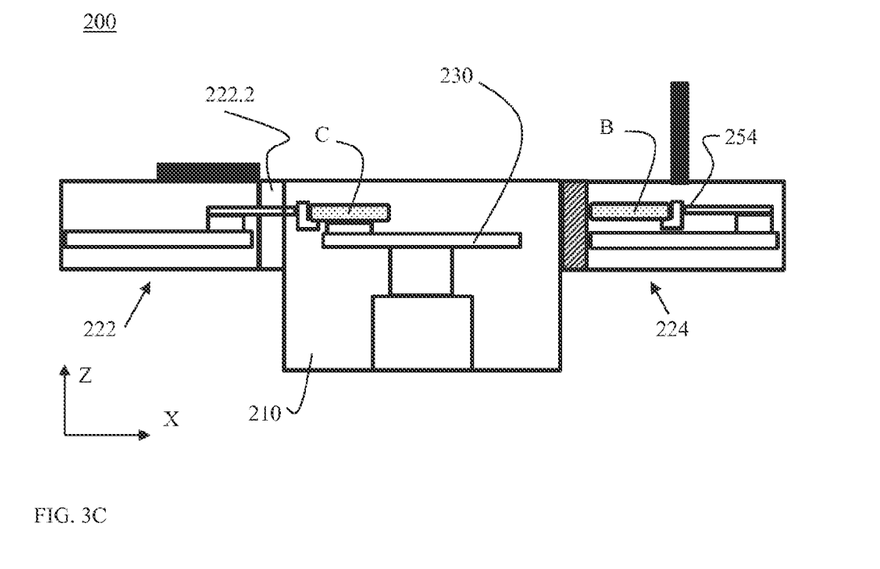

A possible sequence of steps using a vacuum chamber having two load locks is illustrated in FIGS. 3A to 3C. FIGS. 3A-3C schematically depict a cross-sectional view in a vertical plane (XZ-plane).

FIG. 3A shows an inspection apparatus 200 according to an embodiment of the present invention. In the embodiment as shown, the inspection apparatus comprises a vacuum chamber 210 having two load locks 1 and 2, also indicated by reference numbers 222 and 224. Three components (Products A, B and C), e.g. objects such as pellicles for use in an EUV lithographic apparatus, are located in the vacuum chamber 210 and load locks 222 and 224. Load locks 222 and 224 may e.g. have a similar structure as the load lock 120, i.e. including a first door and a second door and a load lock chamber, as described above. In the embodiment as shown, Product A has already been processed in the vacuum chamber 210 and has been moved to load lock 224. Load lock 224 has been sealed off from the vacuum chamber 210 and is being returned to ambient conditions ready for unloading of product A. Product B has been loaded into the vacuum chamber 210 from load lock 222 for processing. Load lock 222 has subsequently been sealed off from the vacuum chamber and returned to ambient conditions to enable Product C to be loaded into load lock 1. FIGS. 3A-3C further schematically show a stage apparatus 230 arranged inside the vacuum chamber 210. In the embodiment as shown, the load locks 222 and 224 further include transfer mechanisms 252 and 254 for transferring objects from the load lock chambers to the vacuum chamber and vice versa.

Next, while Product B is measured and/or processed in the vacuum chamber, load lock 1, 222 containing Product C can be brought from ambient pressure to vacuum conditions. Subsequently, Product A is unloaded from load lock 2, 224, which is then returned to vacuum conditions ready to receive Product B. The door 224.2 separating load lock 224 from the vacuum chamber 210 is then opened and Product B is delivered to load lock 224 after the measuring process is finished. This is illustrated in FIG. 3B.

Simultaneously, load lock 222 continues to be brought to vacuum conditions in order to allow Product C to be passed to the vacuum chamber.

Once load lock 222 has been brought to vacuum conditions, the door 222.2 separating load lock 222 from the vacuum chamber 210 is opened and Product C is transferred to the vacuum chamber 210. At the same time, load lock 224 is sealed off from the vacuum chamber 210 and can be vented to ambient pressure so Product B can be unloaded. Finally, measurement and/or processing of Product C can take place while the next component is loaded into load lock 222. These steps are schematically shown in FIG. 3C.

In accordance with an embodiment, the inspection apparatus may further comprise a radiation source for inspecting the object and a detector for receiving emitted, reflected or transmitted radiation from the object, in order to perform an inspection or quality assessment process. Within the meaning herein, such a radiation source may include any suitable form of radiation, e.g. electromagnetic radiation or a particle beam such as an electron beam or ion beam.

According to a second aspect, there is provided an inspection apparatus for inspecting objects such as pellicles.

Some lithographic apparatus comprise a pellicle attached to a patterned reticle. The pellicle is a transmissive film which is spaced a few millimetres away from the pattern of the reticle. A contamination particle which is received on the pellicle is in the far field with respect to the pattern of the reticle, and consequently does not have a significant impact upon the quality of image which is projected by the lithographic apparatus on to a substrate. If the pellicle were not present then the contamination particle may lie on the pattern of the reticle and could therefore obscure a portion of the pattern, thereby preventing the pattern from being projected correctly on to the substrate.

An inspection apparatus, also referred to as a pellicle qualification system may be configured to determine optical properties (such as reflectivity and/or transmissivity) of the pellicle in order to determine whether or not the pellicle is of a high enough quality to be used in a lithographic apparatus. Such a pellicle qualification or inspection may involve directing a measurement radiation beam towards the pellicle and using radiation sensors to detect an intensity of the measurement radiation beam before and after it has interacted with the pellicle. This enables a comparison of characteristics of the measurement radiation beam before and after it has interacted with the pellicle, thereby enabling determination of how the pellicle has affected the measurement radiation beam and whether or not the pellicle is of a high enough quality to be used in a lithographic apparatus.

One known pellicle qualification system uses two radiation sensors to detect an intensity of the measurement radiation beam before the measurement radiation beam has interacted with the pellicle. A first portion of the measurement radiation beam is directed along a main measurement path where it interacts with the pellicle. A second portion of the measurement radiation beam is directed to the radiation sensors. Therefore, the two radiation sensors are located on different optical paths and/or receive incident radiation at different angles to the main measurement path. The optical paths may differ from each other. The differences between different optical paths may vary over time. For example, optical components in the different optical paths (e.g. lenses and/or mirrors) may degrade differently, temperature and subsequent thermal deformations may vary, vacuum or gas variations in the optical path, etc. Due to the different optical paths, there are random differences between the first and second portions of the measurement radiation beam and thereby reduce an accuracy of the known pellicle qualification system. Known methods of improving an accuracy of the known pellicle qualification system involve the use of beam splitters and/or grazing mirrors. However, such optical components reduce an intensity of the radiation, which in turn negatively affects an accuracy of the system. The inspection apparatus according to the second aspect provides an alternative manner to measure the radiation beam as applied to inspect or qualify a pellicle.

Figure 4:
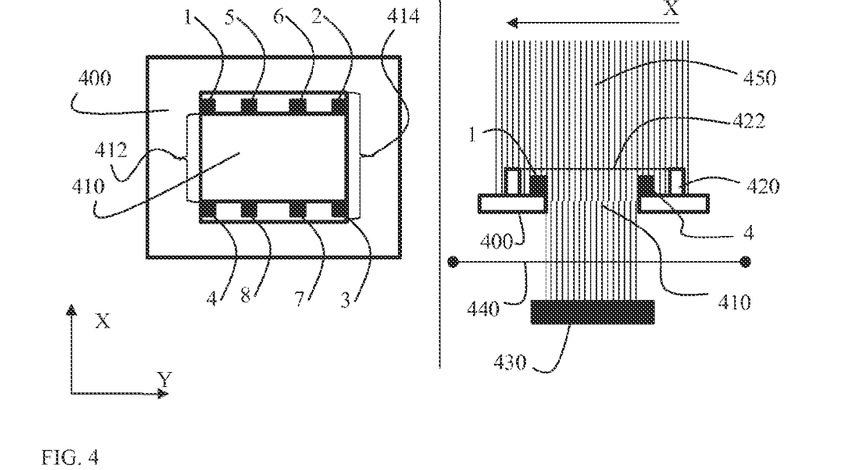
FIG. 4 depicts a radiation beam measurement system as can be applied in an inspection apparatus according to an embodiment.

FIG. 4 schematically shows a top view (left side of FIG. 4) and a side view (right side of FIG. 4) of the novel radiation beam measurement system as applied in the inspection apparatus according to the second aspect, also referred to as a pellicle qualification system.

The inspection apparatus according to the second aspect may e.g. comprise:
 a chamber configured to provide in a conditioned atmosphere for inspecting the object;
 a load lock forming an interface between the chamber and an ambient environment;
 a radiation beam source configured to generate a radiation beam for inspecting the object;
 a radiation beam measurement system configured to measure a characteristic of the radiation beam.

In an embodiment, the conditioned atmosphere may e.g. be a vacuum environment. Depending on the type of radiation used for the inspection or qualification, other types of conditioned atmospheres or environment may be considered as well.

Within the meaning herein, any suitable type of radiation may be used as a radiation beam source for the inspection or qualification of the pellicle.

In accordance with the second aspect, the radiation beam measurement system as applied in the inspection apparatus or pellicle qualification system further comprises:
 a member arranged in an optical path of the radiation beam between the radiation beam source and the object, the member comprising an aperture to allow part of the radiation beam to propagate to the object, and
 at least one radiation sensor arranged on the member and configured to measure to the characteristic of the radiation beam.

In an embodiment, the radiation beam measurement system comprises a plurality of radiation sensors (e.g. four or eight radiation sensors) arranged on a member that is arranged in the optical path of the radiation beam between the radiation beam source and the object, i.e. downstream of the radiation beam source and upstream of the object. In the example of FIG. 4, the member 400 of the radiation beam measurement system is equipped with eight radiation sensors, reference numbers 1 to 8. In the embodiment as shown, the member 400 comprises a substantially rectangular aperture 410. The eight radiation sensors 1-8 are arranged on or along two opposite sides of the aperture 410. In FIG. 4, left side, reference number 412 refers to the width of the radiation beam after passing through the aperture 410, whereas reference number 414 refers to the width of the radiation beam that is incident on the member 400. In an embodiment, the radiation beam measurement system comprises at least one radiation sensor configure to measure a characteristic, e.g. an intensity of the radiation beam, i.e. the incoming radiation beam as depicted.

It may be preferable to use a larger number of radiation sensors because any noise present in the measurement performed by the radiation beam measurement system may be reduced by averaging the measurements performed by each radiation sensor.

The radiation sensors may be configured to detect EUV radiation. The radiation sensors may, for example, comprise photodiodes and/or cameras e.g. charge-coupled devices. The radiation beam measurement system may be configured to determine a spatial intensity profile of an incident radiation beam. The radiation sensors may detect the measurement radiation beam proximate to a central axis of the optical path of the radiation beam that is to be measured.

In an embodiment, the inspection system or pellicle qualification system may comprise a spectral purity filter (SPF), 422 and a detector 430, e.g. a charge-coupled device (CCD). In the embodiment as shown the detector 430 is arranged downstream of the object, i.e. the pellicle 440 that is to be inspected or qualified. In such embodiment, the detector thus receives radiation that is transmitted through the object 440. In general, the inspection apparatus according to the second aspect may be configured to receive any type of radiation caused by interaction of the radiation beam with the object 440. Such radiation can e.g. include radiation that is emitted by the object or radiation that is reflected by the object or radiation that is transmitted by or through the object.

The spectral purity filter 422 may be configured to filter the incoming radiation beam 450 before the radiation beam 450 is incident on the pellicle 440. The SPF 422 may thus be arranged upstream of the pellicle 440. The CCD, in general the detector 430, may be configured to detect the radiation beam 450 after the radiation beam 450 has interacted with the pellicle 440. The radiation sensors 1 to 8 of the radiation beam measurement system may be arranged so as to detect the radiation beam 450 after the radiation beam has interacted with the spectral purity filter 422 and before the radiation beam has interacted with the CCD 430. A comparison between the measurement performed by the radiation beam measurement system and the measurement performed by the CCD of the pellicle qualification system may be used to determine what effect the pellicle 440 had on the radiation beam, and thereby determine whether or not the pellicle 440 is suitable for use in a lithographic apparatus.

The spectral purity filter 422 may be held in place by a support. In the embodiment as shown, the spectral purity filter 422 is mounted to the member 400 via the support 420. In the embodiment as shown, the member 400 comprises an aperture 410 for at least part of the radiation beam (which may be referred to as a first portion of the radiation beam) to pass through before the radiation beam is incident on the pellicle. The radiation sensors 1 to 8 of the radiation beam measurement system may be installed on the member 400. Edges of the radiation sensors may be substantially aligned with edges of the aperture of the member 400. The surfaces of the member 400 on which the radiation beam measurement system is installed, and the radiation sensors of the radiation beam measurement system, act to block some of the incident radiation beam 450 (which may be referred to as a second portion of the incident radiation beam). Since the edges of the radiation sensors are substantially aligned with edges of the aperture 410 of the member 400, the radiation beam measurement system is able to measure characteristics of the radiation beam 450 as close as possible to a central axis of the radiation beam without affecting the portion of the radiation beam that interacts with the pellicle (and which may be detected by the CCD 430 of the inspection apparatus or pellicle qualification system). The radiation beam measurement system may be the final optical component to interact with the radiation beam before the radiation beam is incident on the pellicle 440. The influence of all other optical components in the optical path of the radiation beam is thereby included and accounted for in the measurement performed by the radiation beam measurement system. Thus, variations in the optical path of the radiation beam have less of an effect on the accuracy of the novel radiation beam measurement system compared to the known radiation beam measurement system.

The radiation beam measurement system advantageously enables in-situ monitoring of characteristics (e.g. energy, spatial intensity profile, dose, etc.) of the incident radiation beam without significantly affecting the radiation beam. This may improve an accuracy of subsequent measurements performed using the radiation beam after the radiation beam has interacted with the pellicle. The radiation beam measurement system allows for a set-up calibration using the CCD 430 as a reference. For example when there is no pellicle 440 disposed between the support and the CCD 430, both the radiation sensors 1 to 8 of the radiation beam measurement system and the CCD 430 can be used to determine characteristics of the incident radiation beam 450.

The direct measurement from the CCD 430 of the first portion of the radiation beam can be used to calibrate the in-direct measurement from the radiation sensors 1 to 8 of the radiation beam measurement system. The radiation beam measurement system is compact and easy to install and use. The radiation beam measurement system may be capable of reconstructing a spatial intensity profile of the radiation by, for example, using a combination of known positions of the radiation sensors, performing reference measurements, comparing measurements with a database of information regarding characteristics of the radiation beam, and fitting algorithms. The radiation beam measurement system may be less expensive to install and/or operate than known radiation beam measurement systems.

Figure 5:
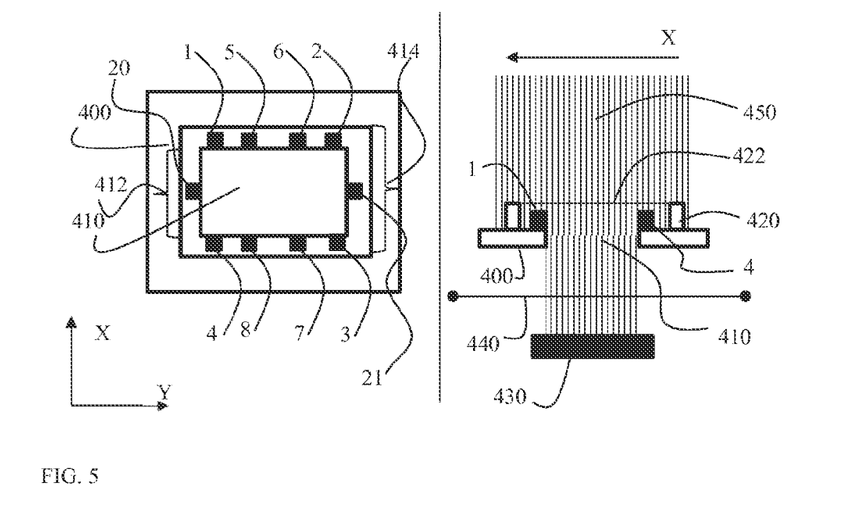
FIG. 5 depicts another radiation beam measurement system as can be applied in an inspection apparatus according to an embodiment.

In the embodiment as shown in FIG. 4, the radiation sensors 1 to 8 are provided along two opposite sides of the aperture 410, said opposite sides extending in the Y-direction. It may be advantageous to included or provide radiation sensors along one or two sides extending in the X-direction as well. Such an embodiment is schematically shown in FIG. 5. FIG. 5 schematically shows, in addition to the features shown in FIG. 4, a further pair of radiation sensors 20, 21 which are arranged on or along the two opposite sides of the aperture 410 extending in the X-direction.

In an embodiment, at least one radiation sensor is arranged along a circumference of the aperture 410 of the member 400 of the radiation beam measurement system. In an embodiment, at least one radiation sensor is arranged along each side of the aperture 410 of the member 400.

In an embodiment, the inspection apparatus may advantageously be used for measuring transmission and/or reflection characteristics of objects such as pellicles, in particular EUV pellicles. In such embodiment, the inspection apparatus may thus be referred to as an EUV pellicle transmission and/or reflection measurement tool. In such embodiment, the one or both properties as measured in such tools are:
   a) the EUV radiation transmission through the membrane or pellicle, i.e. the % of EUV radiation vs. total radiation, which is passing unabsorbed by the membrane or pellicle, and/or the EUV radiation reflected by the membrane, and/or
   b) the EUV radiation reflected by the membrane or pellicle, i.e. the % of EUV radiation reflected back by the membrane or pellicle.

It can also be pointed out that part of the EUV radiation may be absorbed by the membrane or pellicle. By measuring both the reflected and transmitted EUV radiation, combined with information on the total EUV radiation towards the membrane or pellicle, the relation between the three radiation components, i.e. reflected, absorbed, transmitted, can be determined. The reflection and transmission property can e.g. be measured with radiation detectors, for example CCD cameras such as CCD 430 as shown above. In particular, a CCD camera can be arranged in an optical path of the transmitted EUV radiation as shown in FIGS. 4 and 5. Similarly, a CCD camera can be arranged in an optical path of the reflected EUV radiation, in order to determine the amount of EUV radiation that is reflected. Such cameras may e.g. be referred to as a T-CCD (transmission) and an R-CCD (reflection).

Embodiments can also be provided according to the following clauses:
   Clause 1: Inspection apparatus for inspecting an object such as a pellicle for use in an EUV lithographic apparatus, the inspection apparatus comprising:
      a vacuum chamber;

a load lock forming an interface between the vacuum chamber and an ambient environment;

a stage apparatus configured to receive the object from the load lock and displace the object inside the vacuum chamber;

wherein the vacuum chamber comprises a first parking position and a second parking position for temporarily storing the object.

Clause 2: The inspection apparatus according to clause 1, further comprising a transfer mechanism configured to transfer the object from the load lock to the stage apparatus and vice versa.

Clause 3: The inspection apparatus according to clause 2, wherein the transfer mechanism is at least partly arranged inside the load lock.

Clause 4: The inspection apparatus according to clause 2, wherein the transfer mechanism is mounted to the stage apparatus.

Clause 5: The inspection apparatus according to any of the preceding clauses, wherein the load lock comprises a first door, a second door and a load lock chamber, the first door being configured to separate the ambient environment from the load lock chamber, the second door being configured to separate the vacuum chamber from the load lock chamber.

Clause 6: The inspection apparatus according to clause 1, wherein the stage apparatus is configured to transfer an object from the stage apparatus to the first parking position and vice versa and wherein the stage apparatus is configured to transfer an object from the stage apparatus to the second parking position and vice versa.

Clause 7: The inspection apparatus according to any of the preceding clauses, wherein the stage apparatus comprises a holder for holding the object.

Clause 8: Inspection apparatus for inspecting an object such as a pellicle for use in an EUV lithographic apparatus, the inspection apparatus comprising:
a vacuum chamber;
a first load lock forming an interface between the vacuum chamber and an ambient environment;
a second load lock forming an interface between the vacuum chamber and an ambient environment;
a stage apparatus configured to receive the object from the first load lock and displace the object inside the vacuum chamber and configured to provide the object to the second load lock.

Clause 9: Inspection apparatus for inspecting an object such as a pellicle for use in an EUV lithographic apparatus, the inspection apparatus comprising:
a chamber configured to provide in a conditioned atmosphere for inspecting the object;
a load lock forming an interface between the chamber and an ambient environment;
a radiation beam source configured to generate a radiation beam for inspecting the object;
a radiation beam measurement system configured to measure a characteristic of the radiation beam, wherein the radiation beam measurement system comprises:
a member arranged in an optical path of the radiation beam between the radiation beam source and the object, the member comprising an aperture to allow part of the radiation beam to propagate to the object, and
at least one radiation sensor arranged on the member and configured to measure the characteristic of the radiation beam.

Clause 10: The inspection apparatus according to clause 9, wherein the at least one radiation sensor is arranged along a circumference of the aperture.

Clause 11: The inspection apparatus according to clause 9 or 10, wherein the aperture has a substantially rectangular shape.

Clause 12: The inspection apparatus according to clause 11, wherein the radiation beam measurement system comprises a radiation sensor along at least two sides of the aperture.

Clause 13: The inspection apparatus according to clause 11 or 12, wherein the radiation beam measurement system comprises at least one radiation sensor along each side of the aperture.

Clause 14: The inspection apparatus according to any of the clauses 9 to 13, wherein the radiation beam measurement system further comprises a spectral purity filter arranged upstream of the member in the optical path.

Clause 15: The inspection apparatus according to clause 14, wherein the spectral purity filter is mounted to the member.

Clause 16: The inspection apparatus according to clause 14 or 15, wherein the at least one radiation sensor is arranged downstream of the spectral purity filter.

Clause 17: The inspection apparatus according to any of the clauses 9 to 16, further comprising a detector configured to receive radiation caused by interaction of the radiation beam with the object.

Clause 18: The inspection apparatus according to clause 17, wherein the radiation comprises radiation transmitted by the object.

Clause 19: The inspection apparatus according to clause 18, wherein the detector is arranged downstream of the object.

Clause 20: The inspection apparatus according to any of the clauses 17-19, wherein the detector comprises a CCD.

Clause 21: EUV pellicle transmission measurement tool comprising an inspection apparatus according to any of the clauses 9 to 20.

Clause 22: EUV pellicle transmission and reflection measurement tool comprising an inspection apparatus according to any of the clauses 9 to 20.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that an embodiment of the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An inspection apparatus for inspecting an object, the inspection apparatus comprising:
   a chamber configured for the inspection of the object therein;
   a load lock forming an interface between the chamber and an ambient environment;
   a radiation beam measurement system configured to measure a characteristic pertaining to a radiation beam for inspecting the object to determine:
   a) a proportion of EUV radiation which passes unabsorbed by the object through the object of a total radiation incident on the object, and/or
   b) a proportion of EUV radiation reflected by the object of a total radiation incident on the object.

2. The inspection apparatus according to claim 1, further comprising a spectral purity filter, arranged upstream of the object, configured to filter the radiation beam before the radiation beam is incident on the object.

3. The inspection apparatus according to claim 1, further comprising a detector configured to detect the radiation beam after the radiation beam has interacted with the object.

4. The inspection apparatus according to claim 1, wherein the characteristic measured is of radiation that is emitted by the object.

5. The inspection apparatus according to claim 1, further comprising a spectral purity filter configured to filter the radiation beam before the radiation beam is incident on the object and a detector configured to detect the radiation beam after the radiation beam has interacted with the object and wherein the measurement system is arranged to detect the radiation beam after the radiation beam has interacted with the spectral purity filter and before the radiation beam has interacted with the detector.

6. The inspection apparatus according to claim 1, wherein the radiation beam measurement system is configured to measure the characteristic of the radiation beam as close as possible to a central axis of the radiation beam without affecting the portion of the radiation beam that interacts with the object.

7. The inspection apparatus according to claim 1, wherein the radiation beam measurement system is configured to determine the proportion of EUV radiation transmission which passes unabsorbed by the object through the object of a total radiation incident on the object.

8. The inspection apparatus according to claim 1, wherein the radiation beam measurement system is configured to determine the proportion of EUV radiation reflected by the object of a total radiation incident on the object.

9. An EUV transmission measurement tool comprising the inspection apparatus according to claim 1.

10. An EUV transmission and reflection measurement tool comprising the inspection apparatus according to claim 1.

11. An inspection apparatus for inspecting an object, the inspection apparatus comprising:
    a chamber configured for the inspection of the object therein;
    a load lock forming an interface between the chamber and an ambient environment;
    a radiation beam measurement system configured to measure a characteristic of a radiation beam for inspecting the object, the radiation beam measurement system comprising a detector configured to receive emitted, reflected or transmitted radiation from the object and further configured to measure, at a position before the object and along a path of the incoming radiation beam toward the object, a characteristic of the radiation beam.

12. The inspection apparatus according to claim 11, wherein the load lock comprises:
    a first load lock forming an interface between the vacuum chamber and an ambient environment;
    a second load lock forming an interface between the vacuum chamber and an ambient environment; and
    a stage apparatus configured to receive the object from the first load lock and displace the object inside the vacuum chamber and configured to provide the object to the second load lock.

13. The inspection apparatus according to claim 11, wherein the detector comprises at least one radiation sensor configured to detect EUV radiation and measure a characteristic of the incoming radiation beam.

14. The inspection apparatus according to claim 13, wherein the at least one radiation sensor is configured to determine an energy, dose or a spatial intensity profile of the incoming radiation beam.

15. The inspection apparatus according to claim 13, wherein the at least one radiation sensor is configured to detect the incoming radiation beam proximate to a central axis of the optical path of the incoming radiation beam.

16. The inspection apparatus according to claim 11, further comprising a spectral purity filter arranged to be in the optical path of the radiation beam and arranged to be upstream of the object in the optical path.

17. The inspection apparatus according to claim 11, wherein the radiation beam measurement system is configured to determine EUV reflectivity and/or EUV transmissivity of the object.

18. An EUV transmission measurement tool comprising the inspection apparatus according to claim 11.

19. An EUV transmission and reflection measurement tool comprising the inspection apparatus according to claim 11.

20. A method of inspecting an object, the method comprising:
- directing a measurement radiation beam towards the object to be inspected; and
- using a radiation sensor to detect the measurement radiation beam along a path of the beam towards the object and to detect the measurement radiation beam after it has interacted with the object, to provide in-situ monitoring of a characteristic of the radiation beam without significantly affecting the radiation beam.

* * * * *